United States Patent [19]

Mino et al.

[11] Patent Number: 5,059,509

[45] Date of Patent: Oct. 22, 1991

[54] MULTICOLOR IMAGE-FORMING METHOD

[75] Inventors: Hisashi Mino, Saitama; Takeshi Iijima, Higashimatsuyama; Kuniaki Monden, Sakado, all of Japan

[73] Assignee: Sanyo-Kokusaku Pulp Co., Ltd., Tokyo, Japan

[21] Appl. No.: 679,999

[22] Filed: Apr. 1, 1991

Related U.S. Application Data

[60] Continuation of Ser. No. 325,814, Mar. 20, 1989, abandoned, which is a division of Ser. No. 225,582, Jul. 28, 1988, abandoned, which is a continuation of Ser. No. 914,578, Oct. 3, 1986, abandoned, which is a continuation of Ser. No. 634,254, Jul. 25, 1984, abandoned.

[30] Foreign Application Priority Data

Jul. 27, 1983 [JP] Japan ................................ 58-137346

[51] Int. Cl.$^5$ ........................ G03C 11/12; G03C 1/90
[52] U.S. Cl. .................................... 430/257; 430/256; 430/259; 430/263; 430/952
[58] Field of Search ............... 430/257, 258, 256, 259, 430/262, 263, 952, 143

[56] References Cited

U.S. PATENT DOCUMENTS

| | | | |
|---|---|---|---|
| 3,671,236 | 6/1972 | Van Beuselcom | 430/257 |
| 3,681,074 | 8/1972 | Poot | 430/143 |
| 3,721,557 | 3/1973 | Inoue | 430/257 |
| 3,798,034 | 3/1974 | Laridon | 430/257 |
| 3,884,693 | 5/1975 | Bauer et al. | 430/263 |
| 4,260,673 | 4/1981 | Krech | 430/143 |
| 4,366,223 | 12/1982 | Larson | 430/257 |

FOREIGN PATENT DOCUMENTS

| | | | |
|---|---|---|---|
| 0121046 | 7/1984 | Japan | 430/257 |
| 1440281 | 6/1976 | United Kingdom . | |
| 1441982 | 7/1976 | United Kingdom . | |
| 2001772 | 2/1979 | United Kingdom . | |

*Primary Examiner*—Richard L. Schilling
*Attorney, Agent, or Firm*—Armstrong, Nikaido, Marmelstein, Kubovcik & Murray

[57] ABSTRACT

An improvement in a multicolor image-forming method and a multicolor image-forming material applied to the same, employing a heat transfer photosensitive material comprising a transparent substrate, a colored layer which is soluble in water but insolubilizable by light, and a heat-fusible and bondable intermediate layer therebetween.

9 Claims, No Drawings

MULTICOLOR IMAGE-FORMING METHOD

This application is a continuation of application Ser. No. 325,814 filed Mar. 20, 1989, now abandoned, which is a divisional of application Ser. No. 225,582 filed July 28, 1988, now abandoned which is a continuation of application Ser. No. 914,578 filed Oct. 3, 1986, which, in turn, is a continuation of application Ser. No. 634,254 filed July 25, 1984. Application Ser. Nos. 914,578 and 634,254 are now abandoned.

BACKGROUND OF THE INVENTION

The present invention relates to a multicolor image-forming method and multicolor image-forming materials to be used in performing the method. The materials of the present invention are particularly suited to a method for preparing a prepress color proof capable of being used in the course of proof work indispensable to a photomechanical process and materials to be used in performing the method.

The prepress color proof is used for the purpose of checking color, tone, etc. to be obtained after printing at a stage just before the plate-making, that is, at a stage of screened color separation positive or negative before processing the plate, similar to a press proof made customarily in color printing by photographic means. With regard to the preparation of this prepress color proof, there have been known a Surprint method, overlay method and transfer method hitherto as principal methods according to their types of color proof making.

Surprint method is a method to form a multicolor image, wherein colored photosensitive solutions in each color are coated in turn onto a sheet of white substrate and printing is repeated using screened color separation positives or negatives each color. Overlay method is one for proofing by superposing prints, wherein printings in each color are made on transparent substrates coated with colored photosensitive agents using screened color separation positives or negatives separated each color. Also, the transfer method is one, wherein a multicolor image is formed in turn on a white sheet by means of a transfer process by pressure-sensitive adhesive and transfer by heat.

Among these, however, labor and time are required in performing the Surprint method, since printings are made as the photosensitive solutions in each color are coated in turn. Also, in the overlay method, turbidity is caused resulting in a considerable difference in color compared to the print obtained with printing machine or proof press, since each transparent substrate is superposed. In this respect, the transfer method, wherein a closely related print to the final one is obtainable and yet the procedure is relatively simple, has attracted a great deal of attention. Nevertheless it has problems as follows.

Namely, in the method a pressure-sensitive adhesive, colored photosensitive layer, pressure-sensitive layer and backing layer (release paper coated with releasing agent) are principally layered on the substrate in order. As a sticky surface appears by removing the backing paper, this is contacted closely enough under pressure with white-base mounting paper to be transferred. The substrate is removed to transfer the colored photosensitive layer to the mounting paper. Then, the colored photosensitive layer is exposed to light in close contact with the screened color separation positive or negative having a corresponding color to said colored photosensitive layer, developed with the exclusive developing solution, and dried to obtain a separated colored image. With regard to the other colors, the same procedure is further repeated on the image obtained as above to form a multicolor image. Since the constitution of the color sheet for the transferring in said process is complicated, labor and time are required to form the multicolor image and the material is relatively expensive. Moreover, since the image formed previously is hidden in the color-processed layer on the transferring of second and subsequent colors after the colored photosensitive layer was transferred, there are also such shortcomings on exposure as discrimination being difficult and matching registration, of image being hard to do.

Also, there are many proposals including a method where transferring is carried out by means of heat in place of pressure-sensitive adhesive. For example, a method (U.S. Pat. No. 3203805), wherein a light-exposed area is made to not exhibit a stickiness if a exposure is made through the screened color separation positive or negative in close contact with one provided with a colored photopolymerizable layer which exhibits stickiness over a fixed temperature on the substrate, the unexposed area alone is transferred by heat to the paper base, etc.; a method (U.S. Pat. No. 4304836), wherein after is exposed and developed the colored photopolymerizable layer on a substrate, the colored image is transferred by heat to the base having thermosensitive adhesive; a method (U.S. Pat. No. 3721557, Japan Patent Publication 15326/1971, Japan Patent Publication 441/1974), wherein after exposure and development of substrate/release layer/colored photosensitive layer to obtain a colored image, the thermosensitive adhesive (in this case pressure-sensitive adhesive may also be used) is coated onto said image surface or the surface to receive the image and the heat transferring is conducted; a method as published in Japan Unexamined Patent Publication 41830/1972, wherein a backing layer having a colored image formed by the exposure and the development of a material consisting of substrate/heat-fusible and bondable backing layer for colored image/assistant fixing layer for colored image (heat-fusible and bondable property is not necessarily indispensable)/colored photosensitive layer (not limited), is fused and bonded mutually to a transfer surface and then the colored image is transferred by heat together with the backing layer for colored image by releasing and removing the substrate, or the like.

The constitution of these methods is relatively simple and the registration of image between different colors is easy because the image is transferred. However, all of them have a material with a heat-adhesive property only on one side, that is, on either an image surface or the surface of a transfer material. Accordingly, defective transferring is apt to occur and the bonding of the colored image is insufficient to the transfer surface. Moreover, since a fairly high temperature is required to obtain complete transferring and bondability, deformation of the image by heat, dimensional change in the image surface provided the transfer substrate is a plastic film, etc., and the like can occur leading to undesirable results such as the occurrence of discrepancy of the image, etc. Also, such means where the adhesive is applied afterwards, etc. are disadvantageous because of the complicated procedure, the requirement of fairly extensive labor and the lack of reproducibility.

In view of above-mentioned points, the inventors have studied diligently to find a multicolor image-forming method and materials to be used in performing said method having many advantages and applicable also to the color proof method. Namely, the inventors have adopted the transfer method, in particular, the heat transfer process method among the processes described above, to develop a method which is capable of making up for the defects which are unavoidable by the above-mentioned heat transfer processes. The advantages are shown in that the transferring is complete and easy not only of the first color but also of the second and subsequent colors, that the bondability of the image to the transfer surface is excellent after heat transfer, that deformation of image, the dimensional change, etc. are absent and the registration of the image between different colors is easy as well as complete because of the capability of transferring even at a relatively low temperature through the adequate selection of thermosensitive adhesive (heat-fusible and bondable substance), that simplified proofing by the overlay method is possible at a stage before transferring, that an inexpensive photosensitive material can be used, that the environmental aspects and the safety problems such as explosion, etc. are favorable because of the capability of carrying out all of the treatments in the lighted room and also carrying out the developing treatment with water alone, that the constitution of the material is simple and the possible savings are great not only in the material cost but also in the production cost, and the like.

SUMMARY OF THE INVENTION

In other words, the present invention provides a multicolor image-forming method characterized in that a heat transfer photosensitive material provided with a colored layer soluble in water and insolubilizable by light on a transparent substrate through a heat-fusible and bondable intermediate layer is treated by the stages described below:

(1) A stage, wherein the heat transfer photosensitive material is exposed to the active rays of said photosensitive material through a screened color separation contacted closely therewith, and then the unexposed area is dissolved out and removed by washing with water to form an image.

(2) A stage, wherein the image surface formed as above is further contacted closely with a heat-fusible and bondable surface of a transfer material having a heat-fusible and bondable layer, subjected to heat and pressure, and then the transparent substrate is stripped off from the intermediate layer to transfer the colored image to the transfer material together with the intermediate layer.

Thereby, at the stage (1), photosensitive materials having a colored layer of different colors are arranged and each one is exposed in close contact with the screened color separation selected corresponding to each color, and washed with water to dissolve out and remove and to form the image. At the stage (2), the colored image having a specific color among those formed above is transfer to the material, and then, (3) A stage, wherein another image surface of the photosensitive material, the colored image thereof having a different color from above, is allowed to contact closely with the previously transferred surface of the transfer, the transferring thereto having been finished at the stage (2), subjected to heat and pressure, and then the transparent substrate is stripped off from the intermediate layer to transfer the different colored image to the transfer material together with the intermediate layer.

Thereby, the stage (3) is repeated, if the transferring of the third and subsequent colors is desired.

Moreover, the present invention provides a material to be used for forming a multicolor image characterized in that a heat-fusible and bondable intermediate layer of the heat transfer photosensitive material among the materials used in performing the above-mentioned multicolor image-forming method is selected from substances which are insoluble in water, harmless to hue and transparency, able to become sticky and bondable on heat fusion despite having nonstickiness at room temperature, releasable easily from the transparent substrate at room temperature, and bondable closely enough to the colored layer to be provided on it and insolubilized by light particularly after photoinsolubilization. Also, the invention provides a material to be used for forming a multicolor image characterized in that the water-soluble and photoinsolubilizable colored layer of the heat transfer photosensitive material among said materials is composed of a water-soluble polymeric substance having a film-forming property, photoinsolubilizing agent and coloring agent as major components. Furthermore, the invention provides a material to be used for forming a multicolor image characterized in that with regard to the transfer material so among said materials, such substance is layered to as nonsticky at room temperature and able to become sticky and bondable on heat fusion at least on one side.

DESCRIPTION OF PREFERRED EMBODIMENTS

In following, the present invention will be explained in more detail. Among the materials to be used for forming a multicolor image according to the invention, as the transparent substrates usable for the heat transfer photosensitive material, transparent plastic films such as polyethylene terephthalate, polypropylene, polyethylene, polyvinyl chloride, polystyrene, polycarbonate, triacetate, etc. can be mentioned. In particular, biaxially stretched polyethylene terephthalate film is preferable because of its predominances in strength, heat resistance, dimensional stability, transparency, etc. The thickness of the substrate is suitably about 50 to 150μ, though there is no special limitation.

Next, the explanation will be given about the intermediate layer to be constituted between the above-mentioned substrate and the colored layer insolubilizable by light. Said intermediate layer is one playing an important role in the invention and can be composed of one or two layers. In the case of one layer, it is selected from substances which are insoluble in water, harmless to hue and transparency, able to exhibit stickiness and bondability on heat fusion despite having nonstickiness at room temperature, releasable easily from the afore-mentioned transparent substrate at room temperature, and bondable closely enough to the colored layer to be provided on it and insolubilized by light particularly after photoinsolubilization. In the case of two layers, the first layer to be layered directly on the transparent substrate is not necessarily insoluble in water, and mainly the releasing property from the substrate should be considered preferentially. As the second layer to be layered on the first, a substance which is insoluble in water and has a sufficient bondability to the colored layer to be provided on it particularly after photoinsolubilization should be selected. Of course, both the first and the second layer are indispensable to be composed of a substance which is harmless to hue and transparency and exhibits the stickiness and the bondability on heat fusion despite having nonstickiness at room temperature. As the substances to form the intermediate layer as described above, for example, the following polymeric substances having a film-forming property can be mentioned.

Polyacrylic acid ester and copolymer of acrylic acid ester

Polymethacrylic acid ester and copolymer of methacrylic acid ester

Polyacrylamide and copolymer of acrylamide

Polyvinyl acetate and copolymer of vinyl acetate

Polyvinyl chloride and copolymer of vinyl chloride

Polyvinylidene chloride and copolymer of vinylidene chloride

Polystyrene and copolymer of styrene

Copolymer of ethylene such as ethylene and vinyl acetate, ethylene and acrylic acid ester, ethylene and vinyl chloride or ethylene and acrylic acid Polyvinyl acetal such as polyvinyl butyral or polyvinyl formal, Polyester resin, Polyamide resin such as nylon or copolymerized nylon Various rubbers such as synthetic rubber and chlorinated rubber Polyolefin such as polyethylene or polypropylene Cellulose derivatives Shellac Various waxes Besides, mutual mixtures of these polymeric substances or mixed systems with other substances such as other polymeric substances, plasticizers, supercooling substances, etc. can also be used. For example, a combination of a substance having stickiness at room temperature with another substance which prevents said stickiness, or inversely a combination of a substance exhibiting no stickiness even on heating with a tackifying substance, plasticizer, etc. is conceivable. Therefore, not only a single substance but also various combinations are conceivable according to the type of substrate, etc. if need be, so that the substance for the intermediate layer is not necessarily confined to the above-mentioned substances. For the purpose of layering the intermediate layer on the transparent substrate, a solution of the above-mentioned polymeric substance may be coated onto the substrate and dried according to a conventional method, the solid-state afore-mentioned polymeric substance may be coated by means of heat fusion (hot-melt coating), or a film made of the afore-mentioned polymeric substance may be laminated. The thickness of the intermediate layer is preferably more than $1\mu$, desirably 3 to $10\mu$.

Next, an explanation will be given about the colored layer to be constituted on the intermediate layer described above and insolubilizable by light. As substances insolubilizable by light, various ones have been proposed and utilized hitherto. As a result of extensive investigation on the assumption that it should be possible to dissolve out and to develop with water alone at the stage (1) in the invention, it became clear that a combination consisting of water-soluble polymeric substance having a film-forming property, photoinsolubilizing agent and coloring agent is best as the colored layer insolubilizable by light.

Moreover, as the water-soluble polymeric substances having a film-forming property, many ones such as polyvinyl alcohol, gelatin, casein, glue-alginic acids, gums, cellulose derivatives such as carboxymethyl cellulose, hydroxyethyl cellulose, etc., polyacrylic acid and its salts, polymethacrylic acid and its salts, polyacrylamide, polyethylene oxide, polyvinyl pyrrolidone, and the like can be mentioned. While, as the substances to insolubilize them by light, that is, photoinsolubilizing agents, there are diazonium salts, their condensation products, tetrazonium salts, bichromates, etc. So, many combinations are possible.

The inventors have investigated diligently these combinations according to the invention taking account of the photosensitivity (rate of photoinsolubilization), the developing property (washability), the stability on preservation, the strength of film after photoinsolubilization, the water-resisting property, the safety, etc., and have found that all of these functions can be satisfied particularly with a combination of either one or a mixture of polyvinyl alcohol, gelatin, polyacrylamide and its copolymer for the water-soluble polymeric substance and a condensation product of diazonium salt, in particular, the condensation product of p-diazodiphenylamine with formalin for the photoinsolubilizing agent.

The addition ratio of the photoinsolubilizing agent to the water-soluble polymeric substance described above is 2 to 20%, more desirably 5 to 12%.

Photopolymerization systems using combinations consisting of water-soluble polymeric substances such as polyvinyl alcohol, etc., polyfunctional acrylate-based monomer, photopolymerization initiator, etc. have already been proposed. The inventors examined these systems, but these proved generally to be poor in washability. In particular, the shadow area (area of halftone to be washed with water which is very minute), etc. in the image was difficult to be dissolved out, for example, by a spray alone and required such means as rubbing off, etc. resulting in an unsatisfactory developing property. Moreover, these showed a reaction obstacle, etc., owing to oxygen in the air as serious defect in the photopolymerization systems. Therefore, the components described previously were selected in the invention.

With regard to the coloring agent, extensive selection is possible so far as the pigment is dispersible in water. However, the coloring agent is necessary for it to have an excellent miscibility with the water-soluble polymeric substance and the photoinsolubilizing agent mentioned above and have no harmful effects on the photosensitivity, the developing property, etc. Also, as for the color, since four colors, cyan, magenta, yellow and black are used basically for the color proof in the photomechanical process, each color is desired naturally to be close to each printing ink. The addition amount of the coloring agent should be determined according to the expected optical reflection density of said colored image after the image formed is transferred to the transfer material, though it depends on the type of coloring agent and the coating weight of the colored layer.

Additionally, it is also necessary to take the dispersibility of the coloring agent (pigment) into consideration. For example, the diameter of the particles is preferably as small as possible from viewpoints of resolution, etc. Although water-soluble dyes can be used as the coloring agents, there exist many problems in this case such as compatibility with the photoinsolubilizing component. In particular, the photoinsolubilizing agent described before is generally poor and the photosensitivity (sensitivity) and the stability on storage are lowered under the influence of various added inorganic salts, etc. involved in the dye, and the exposed area (photoinsolubilized area) is also apt to be dissolved out with water during development under the influence of the dye present. Therefore, they are undesirable.

In addition to the components described above, a stabilizer to prevent dark reaction and a leveling agent, defoamer, surfactant, etc. to improve the coating performance when said colored layer is provided on the transparent substrate can be added to the colored layer insolubilizable by light, if desired.

Moreover, the above-mentioned components are primarily mixed after being dissolved or dispersed into water when said colored layer is provided. Thereby, water-miscible organic solvents such as alcohols, etc. can be used partly as diluents for the purpose of defoaming and improving the coating performance.

Although the thickness of said colored layer is preferably as thin as possible from the viewpoint of resolution including halftone reproducibility, etc. It is most suitable to be within a range of 2 to 5$\mu$ keeping the image density based on the coloring agent in mind.

When above-mentioned colored layer is provided on the intermediate layer, all of the methods publicly known hitherto can be used, and the method is not particularly limited if an uniform film without pinhole, etc. is obtained.

Next, the explanation will be given about the transfer material in the invention. As the substrate, paper, plastic film, paper/plastics composite material, glass plate, metal plate, etc. can be mentioned, and in such cases as employing a transparent substrate according to necessity, it is possible to provide a layer coated with white pigment on the surface in order to obtain the brightness of coated paper. Also, in cases employing substrates liable to have a dimensional change owing to a change in humidity such as paper bases, etc. including paperboard, coated paper, etc., a layer for waterproofing and preventing elongation and contraction can be provided.

As the substances to be used for the heat-fusible and bondable layer constituted at least on one side of the abovementioned substrate or the layer subjected to the coating treatment in case of need, substances which exhibit stickiness and bondability on heat fusion despite the being nonsticky at room temperature and, in more detail, substances which are bondable mutually on heat fusion with the intermediate layer in the heat transfer photosensitive material described above and the colored layer after photoinsolubilization, should be selected. Although these substances are selected, as an example, from the same substances as the ones used for the intermediate layer in the heat transfer photosensitive material described above, a mixed system and the like as well as a single substance can be selected widely in this case taking account primarily of the mutual bondability on heat fusion with the intermediate layer and the colored layer after photoinsolubilization. Additionally, when said heat-fusible and bondable substance is layered on the substrate, it may be coated and dried in a solution state or may be laminated in a film state as in the case of the afore-mentioned intermediate layer. The thickness of said heat-fusible and bondable layer is preferably more than 3$\mu$, particularly 5 to 10$\mu$.

Among the materials obtained according to the invention, in the first place, the heat transfer photosensitive material is exposed to the active rays in close contact with the screened color separation negative for every separated color obtainable in the photomechanical process, and then the unexposed area is dissolved out and removed by washing with water to form an image [stage (1)]. Thereby, a heat transfer photosensitive material having each colored image is obtained by selecting the photosensitive material of the invention corresponding to each separated color (when using a negative film corresponding to cyan plate, the reversal of the image is made in close contact with the photosensitive material of the invention colored in cyan). Since the intermediate layer is made bare at the unexposed area (nonimage area) of said photosensitive material, the fact that the intermediate layer underneath the colored layer is water-insoluble has an important meaning. Namely, if said intermediate layer is water-soluble, the intermediate layer underneath the unexposed area would be dissolved out and removed on washing and developing after exposure. As a result, the heat transferring would not be sufficiently carried out in the subsequent process [stage (2)], and the purpose of the invention would not be achieved.

In other words, although the transferring surface of the material is heat-fused and bonded with the colored layer (image area) after photoinsolubilization, the bonding is incomplete with this alone, and firmer and more complete heat transferring can be obtained by mutual heatfusing and bonding with the heat-fusible and bondable intermediate layer made bare at the unexposed area (nonimage area). Said photosensitive material is usable also for the proofing by the overlay method at this stage if need be. Secondly, the image surface of said photosensitive material is allowed to contact closely with the transferring surface (surface having the heat-fusible and bondable layer) of the transfer material and is subjected to heat and pressure. Thereby, mutual heat-fusing and bonding occur between the intermediate layer (unexposed area, nonimage area) and the heat-fusible and bondable layer of the transfer material (although the mutual heat-fusing and bonding also occur between the photoinsolubilized area of the colored layer, that is, image area, and the heat-fusible and bondable layer of the transfer material, firm adhesion as with the nonimage area cannot be expected since one surface is not heat-fusible and bondable in this case). Then, by stripping off of the transparent substrate of said photosensitive material, the image having separated color is thus transferred easily and firmly to the transfer material together with the intermediate layer [stage (2)].

Further, the colored image of the second color is transferred by heat onto the transferred image formed as above. Thereby, since the heat-fusible and bondable layer (intermediate layer of the first color) is also present on the surface after transferring of the first color, easy and firm transferring can be achieved as in the case of the first color. With regard to the third and subsequent colors, different colored images can be transferred easily in turn together with the intermediate layer as in the case of the second color to form the multicolor image finally on the transfer material. If individual color (basically cyan, magenta, yellow and black) and the density of the colored image formed according to the invention are selected close to those of the printing ink, a multicolor image essentially identical to the final print can be obtained and used for a color proof resembling press sheet.

The light source used for the exposure of the heat transfer photosensitive material of the invention may be one capable of insolubilizing the colored layer effectively, and various types of mercury lamps, carbon arc lamps, xenon lamps, metal halide lamps, chemical fluorescent lamps, etc. can be used.

The following examples will clarify the invention further, but the invention is not confined to these examples.

In the examples, a fomulated amount "parts" means parts by weight in all cases.

EXAMPLE 1

Employing polyethylene terephthalate film biaxially stretched and having a thickness of 75 μ as a substrate, a solution of a copolymer of vinyl chloride and vinyl acetate dissolved in ethyl acetate was coated onto one side of it and dried to form an intermediate layer having a thickness of 3 μ. Then, onto this, a solution having a composition of:

Polyvinyl alcohol (average polymerization degree:

| 1700–2400, saponification degree: 98.5 ± 0.5%), 10% aqueous solution | 100 parts |
| --- | --- |
| Condensation product of p-diazodiphenylamine with formaldehyde | 0.8 part |
| Pigment dispersion (20% aqueous dispersion of carbon black) | 4 parts |
| Water | 100 parts |
| Isopropyl alcohol | 10 parts | was coated and dried to form a colored layer having a thickness of 3 μ, and the heat transfer photosensitive material for black was obtained.

In place of carbon black used in the solution for forming the colored layer described above, Phthalocyanine Blue, Permanent Carmine FB and Permanent Yellow HR were used respectively to obtain the heat transfer photosensitive materials for cyan, magenta and yellow similarly.

The the pigment dispersions were prepared by dispersing the following formulation for 3 hours with an ink mill:

| Pigment | 60 parts |
| --- | --- |
| Nonionic surfactant (mainly polyethylene glycol alkylphenyl ether) | 1 part |
| Water | 240 parts |

The colored photosensitive surface of the heat transfer photosensitive material for black described above was contacted closely with the screened color separation negative film for black plate, and exposed to light for 60 seconds at a distance of 1 m with a high-pressure mercury lamp of 2 kw. Then, the unexposed area was washed with water of ordinary temperature spouting out from a nozzle under a pressure of 1 kg/cm² to dissolve out and remove the unexposed portions. After the water was drained the material was dried with warm air at 50° C. to obtain a positive image colored in black.

With regard to the heat transfer photosensitive materials for cyan, magenta and yellow, positive images colored in cyan, magenta and yellow were obtained respectively, by the same procedure as described above (only exposure times were varied to 20, 30 and 40 seconds, respectively) using a screened color separation negative film corresponding to each color. All of them were excellent in resolution. When these four types of films having the colored positive image were superposed to be observed on white paper, a multicolor image was recognized resulting from the synthesis of each color, and could be used also for simplified proofing and checking.

Further, employing coated paper having a basis weight of 127.9 g/m² as a substrate, a solution of a copolymer of vinyl chloride and vinylidene chloride dissolved into a mixture of ethyl acetate/toluene was coated onto one side of it and dried to form a heat-fusible and bondable layer having a thickness of 6 μ. After preparing the transfer material to be transferred, the image surface of the heat transfer photosensitive material for black having the positive image described previously was superposed onto the transferring surface (heat-fusible and bondable layer). When the substrate of the heat transfer photosensitive material, that is, polyethylene terephthalate film, was stripped off after being pressed between rollers heated to 100° C., the colored positive image was transferred easily to the transferring surface of the transfer material together with the intermediate layer. Also, the bonding was excellent after transferring.

Following this, the heat transfer photosensitive materials having the positive image in cyan, magenta and yellow described previously were used and transferred by heat in turn onto the transfer surface of the positive image colored in black described above by the same procedure as above, and a positive image consisting of four colors was obtained on the coated paper. The second to the fourth color were also transferred easily and the bondings were excellent after transferring. This product closely resembled the final print and could be used for the prepress color proof effectively since the color proof, etc. were carried out easily without printing on a printing machine. In order to make the registering of each color precise, conventional register pin system can be used.

EXAMPLE 2

In the heat transfer photosensitive material described in Example 1, only the intermediate layer was altered. An emulsion of copolymer of vinyl acetate and acrylic acid ester for the first layer (one to be layered directly on the transparent substrate) and a solution of copolymer of a vinyl chloride and vinylidene chloride dissolved in ethyl acetate/toluene for the second layer (one to be layered on the first layer) were coated and dried to obtain thicknesses of 2 μ and 3 μ, respectively, with a total thickness of 5 μ. The components were kept the same completely, and quite the same results were obtained as in Example 1.

EXAMPLE 3

A mixed solution of an emulsion of a copolymer of ethylene and an vinyl chloride and aqueous solution of polyacrylamide (solids ratio, 85:15) was coated onto one side of the same substrate as in Example 1 and dried. Then, onto this, a mixed solution of copolymer of a vinylidene chloride and acrylonitrile and saturated polyester resin (the solvent used is a mixture of toluene, ethyl acetate and dimethylformamide and the solids ratio of the polymeric substances is 70:30) was coated and dried. Each thickness was 2 μ and a total thickness of the intermediate layer was 4 μ. Following this, a solution having a composition of:

| Polyacrylamide, 15% aqueous solution (viscosity is 20,000 cps at 20° C.) | 100 parts |
| --- | --- |
| Condensation product of p-diazodiphenylamine | 1 part |

| | |
|---|---|
| with formaldehyde | |
| Pigment dispersion (20% aqueous dispersion of carbon black) | 12 parts |
| Water | 180 parts |
| Isopropyl alcohol | 20 parts | was coated and dried to form a colored layer having a thickness of 2μ, and the heat transfer photosensitive material for black was obtained.

In place of carbon black used in the solution for forming the colored layer described above, Phthalocyanine Blue, Permanent Carmine FB and Permanent Yellow HR were used respectively to obtain the heat transfer photosensitive materials for cyan, magenta and yellow similarly (the pigment-dispersing conditions were same as in claim 1), and said heat transfer photosensitive materials were printed out and washed with water and developed by the same method as in Example 1 to obtain positive images colored in black, cyan, magenta and yellow, respectively. Suitable printing out times were 70, 30, 40 and 50 seconds, respectively.

Further, employing milky polyethylene terephthalate film internally filled with titanium dioxide, biaxially stretched and having a thickness of 125μ as a substrate, a mixed solution of a copolymer of ethylene and a vinyl acetate and saturated polyester resin (the solvent is mainly toluene and ethyl acetate and the solids ratio of the polymeric substances is 50:50) was coated onto one side of it and dried to form the heat-fusible and bondable layer having a thickness of 5μ. After the transfer material was prepared in this, manner the colored images were transferred to the transfer material in turn by the same procedure as in Example 1 to obtain a four-color image. In this case, the transfer easy even if the surface temperature of the heated rollers was 90° C. This product was also usable for the prepress color proof.

EXAMPLE 4

When a 10% aqueous solution of gelatin (S-778 manufactured by Nippi Co.) was substitutes for the 10% aqueous solution of polyvinyl alcohol in the solution for forming the colored layer of the heat transfer photosensitive material used in Example 1, similar results were obtained.

EXAMPLE 5

When a 15% aqueous solution of a copolymer of acrylamide and diacetone acrylamide (copolymerization ratio is 6:4 and average polymerization degree is 1,000) was substituted for the 15% aqueous solution of polyacrylamide in the solution for forming the colored layer of the heat transfer photosensitive material used in Example 3, a four-color image having a utility as a prepress color proof could be obtained through the same process as in Example 3.

What is claimed is:

1. A method of forming a multi-color image of two or more colors from two or more articles of manufacture, each article of manufacture being a precursor for a multi-color image-forming material and comprising a substrate and two layers thereon, the substrate being a transparent substrate and the layers being an intermediate layer and a colored photo-sensitive layer; wherein:
    the intermediate layer is releasably adhered to the transparent substrate, harmless to hue and transparency and has a first surface releasably adherable to the transparent substrate and a second surface;
    the intermediate layer at the first surface is:
        non-sticky at room temperature, and heat-fusible and mutually bondable, after removal of the transparent substrate, to a subsequently applied photosensitive layer of another precursor which, after photoinsolubilization and removal of water soluble unexposed portions, is firmly bonded to a second surface of the intermediate layer of the another precursor, which second surface of the intermediate layer of said another precursor is also mutually bondable to said first surface;
    the intermediate layer at the second surface is:
        adhered to the colored photo-sensitive layer and firmly adherable to a color image subsequently formed by photoinsolubilization and water development of the colored photo-sensitive layer,
        non-sticky at room temperature,
        heat-fusible and mutually bondable to another heat-fusible and mutually bondable surface, and
        insoluble in water; and
    the colored photo-sensitive layer is adhered to the second surface of the intermediate layer, formed from an admixture of a resin component which is film-forming, water soluble, and photoinsolubilizable, and a coloring agent, and upon exposure of a portion of the colored photo-sensitive layer to active rays, the exposed portions are rendered insoluble in water, the unexposed portions being easily removable by dissolving in water to form a color image;
    the method comprising the steps of:
    (1) providing the article of manufacture;
    (2) superposing a negative manuscript corresponding to the color of the colored layer of the colored photo-sensitive layer on the colored photo-sensitive layer;
    (3) exposing the colored photo-sensitive layer to light through said negative manuscript to cause light-exposed areas of the colored layer to become water-insoluble;
    (4) washing and developing the light-exposed colored photo-sensitive layer with water to remove unexposed water-soluble portions and form an image layer in the article of manufacture;
    (5) contacting directly the image carrying layer of the article of manufacture with a heat-fusible and bondable adhesive layer provided on a transfer material to form a laminate of the article of manufacture and the transfer material;
    (6) heating and pressing the laminate to bond the article of manufacture to the transfer material to form a first color image laminate;
    (7) removing the transparent substrate from the article of manufacture of the first color image laminate to permit the first surface of the heat-fusible and bondable first surface to become the outermost surface of the laminate;
    (8) duplicating steps (2), (3) and (4) using the article of manufacture except that a different color is used;
    (9) contacting directly the different colored image of step (8) with the outermost surface of the laminate in step (7) to form a second laminate of the different color image and the first color image;

(10) duplicating step (6) to form a two-color image laminate; and

(11) duplicating step (7) to permit the first surface of the heat-fusible and bondable first surface of the two-color image laminate to become the outermost surface of the laminate.

2. The method of claim 1, wherein the intermediate layer of each article of manufacture has a thickness of $1\mu$ to $10\mu$.

3. The method of claim 1, wherein the colored photo-sensitive layer of each article of manufacture has a thickness of $2\mu$ to $5\mu$.

4. The method of claim 1, wherein the intermediate layer of an article of manufacture consists of a single layer.

5. The method of claim 1, wherein the intermediate layer comprises a resin selected from the group consisting of polyolefin, polyester and ethylene-vinyl acetate copolymers.

6. The method of claim 1, wherein said resin of the colored photo-sensitive layer (3) of an article of manufacture comprises a water-soluble, film-forming resin and a photo-insolubilizing agent.

7. The method of claim 6, wherein the water-soluble, film-forming resin is selected from the group consisting of polyvinyl alcohol, polyacrylamide and copolymers of acrylamide.

8. The method of claim 1, further comprising repeating each of steps (8) through (11) one or more times using the article of manufacture except that a different color is used each time to form a three or more color image laminate.

9. The method of claim 1, wherein the intermediate layer of an article of manufacture comprises two layers.

* * * * *